(12) United States Patent
 Cote

(10) Patent No.: US 11,042,181 B2
(45) Date of Patent: Jun. 22, 2021

(54) LOCAL CLOCK INJECTION AND INDEPENDENT CAPTURE FOR CIRCUIT TEST OF MULTIPLE CORES IN CLOCK MESH ARCHITECTURE

(71) Applicant: Mentor Graphics Corporation, Wilsonville, OR (US)

(72) Inventor: Jean-Francois Cote, Davie, FL (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 16/669,608

(22) Filed: Oct. 31, 2019

(65) Prior Publication Data

US 2020/0142442 A1   May 7, 2020

Related U.S. Application Data

(60) Provisional application No. 62/754,047, filed on Nov. 1, 2018.

(51) Int. Cl.
  *G06F 1/08* (2006.01)
  *G06F 13/28* (2006.01)
  *G06F 13/40* (2006.01)

(52) U.S. Cl.
  CPC ............... *G06F 1/08* (2013.01); *G06F 13/28* (2013.01); *G06F 13/4022* (2013.01)

(58) Field of Classification Search
  CPC ........ G01R 31/31725; G01R 31/31707; G01R 31/3177; G01R 31/318342; G01R 31/318371; G01R 31/317; G01R 31/31708; G01R 31/318552; G01R 31/31709; G06F 1/08; G06F 1/04; G06F 30/396; G06F 30/367; G11C 7/222; G11C 7/22; G11C 11/4076; G11C 2029/0409; G11C 29/023; H03K 5/135; H03K 5/133
  USPC ........... 327/99, 298; 375/226, 224; 716/113, 716/108; 324/500, 73.1, 750.3; 714/763, 714/726, 731; 326/16, 93, 96; 713/322, 713/503
  See application file for complete search history.

(56) References Cited

U.S. PATENT DOCUMENTS

| | | | |
|---|---|---|---|
| 7,173,462 B1 * | 2/2007 | Wang | H03L 7/093 327/158 |
| 7,275,200 B2 * | 9/2007 | Leung | G06F 11/1056 714/763 |
| 7,861,128 B1 * | 12/2010 | Moore | G01R 31/318541 714/726 |
| 7,911,238 B2 * | 3/2011 | Lin | G06F 1/08 327/99 |
| 9,013,208 B1 | 4/2015 | Rosen | |

(Continued)

*Primary Examiner* — Faisal M Zaman

(57) ABSTRACT

A circuit comprises a burst clock control and gating device configured to generate a modified clock signal in a test mode by allowing a preset number of clock pulses of a clock signal to go through during each clock cycle of a reference clock signal, and a plurality of clock gating devices. Each of the plurality of clock gating devices comprises a multiplexing device, wherein the modified clock signal is coupled to a selector input of the multiplexing device, and input signal generation circuitry configured to ensure the timing of the transitions on the output are derived purely from the timing of the transitions of the clock and not by the timing of the transition of the first and second inputs of the multiplexer.

17 Claims, 13 Drawing Sheets

(56) References Cited

U.S. PATENT DOCUMENTS

| | | | |
|---|---|---|---|
| 2005/0055615 A1* | 3/2005 | Agashe | G01R 31/318552 714/727 |
| 2005/0232050 A1* | 10/2005 | Takahashi | G11C 11/40615 365/222 |
| 2009/0138839 A1* | 5/2009 | Homma | G06F 30/327 716/113 |
| 2009/0268859 A1* | 10/2009 | Sun | H03L 7/00 375/376 |
| 2011/0102010 A1* | 5/2011 | Chiadambaram | G01R 31/31727 324/762.03 |
| 2012/0278674 A1* | 11/2012 | Whetsel | G01R 31/3177 714/727 |
| 2014/0185389 A1* | 7/2014 | Jeon | G06F 3/0679 365/189.05 |
| 2016/0065215 A1* | 3/2016 | Shin | H03K 5/19 327/45 |
| 2016/0116934 A1* | 4/2016 | Ha | G06F 1/3203 327/298 |
| 2017/0357743 A1* | 12/2017 | Larzul | G06F 30/331 |
| 2019/0094298 A1* | 3/2019 | Kusko | G01R 31/318371 |

* cited by examiner

FIG 4
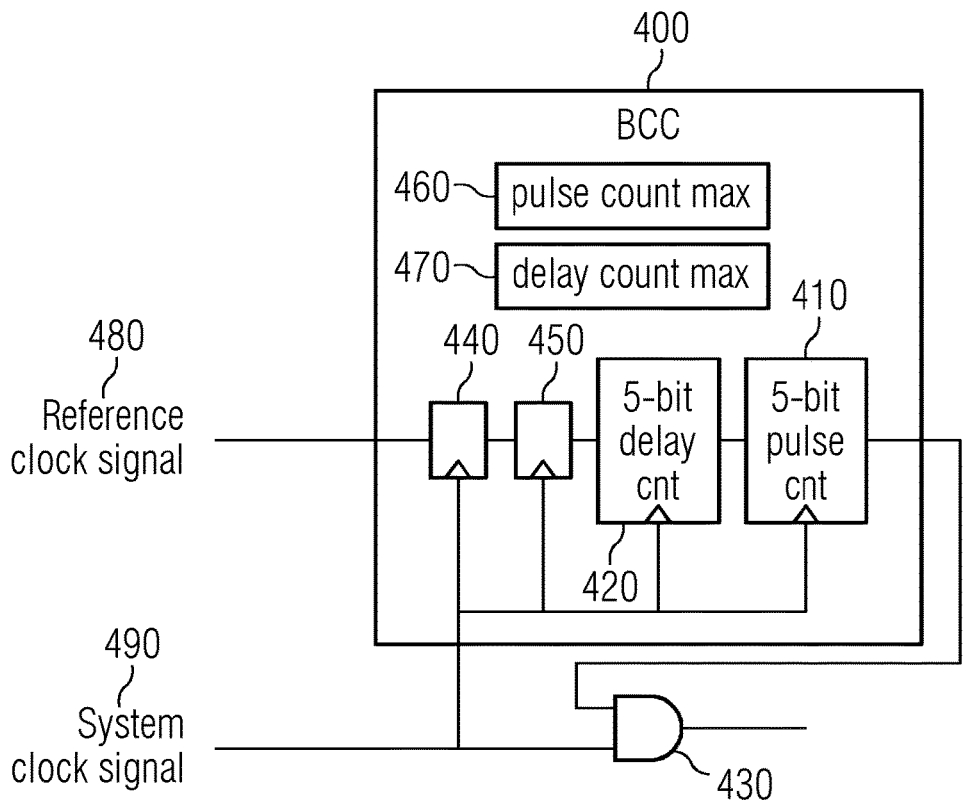
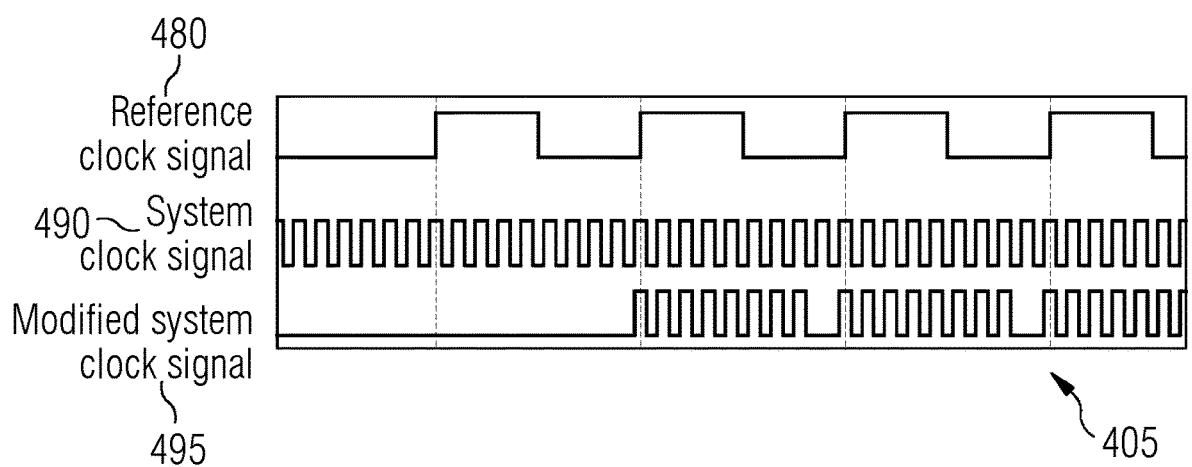

LOCAL CLOCK INJECTION AND INDEPENDENT CAPTURE FOR CIRCUIT TEST OF MULTIPLE CORES IN CLOCK MESH ARCHITECTURE

RELATED APPLICATIONS

This application claims the benefit of U.S. Provisional Patent Application No. 62/754,047, filed on Nov. 1, 2018, which application is incorporated entirely herein by reference.

FIELD OF THE DISCLOSED TECHNIQUES

The presently disclosed techniques relates to clock control and generation for scan test. Various implementations of the disclosed techniques may be particularly useful for independently testing multiple cores of a circuit in clock mesh architecture.

BACKGROUND OF THE DISCLOSED TECHNIQUES

An integrated circuit often takes multiple steps to perform a function and uses an electrical signal known as a "system clock" to pace how quickly each of these steps is performed. The higher the frequency of the system clock pulses, the faster the integrated circuit will operate. A clock (also referred to as "a clock signal") has a period that specifies the duration of a repeated high and low pattern. The period is inversely related to the clock frequency. The duty cycle of the clock is the ratio of high to low time in the period, usually 50%.

An integrated circuit can have multiple system clocks for simultaneously performing multiple tasks. Different system clocks can control different portions or regions of an integrated circuit. Such regions are referred to as clock domains. As integrated circuits grow to include billions of transitions, it is virtually impossible to design them flat (with no partitioning). Electronic Design Automation (EDA) tools would not be able to process them efficiently. Additionally, there is significant reuse of Intellectual Property (IP) from one design to another. Large designs, known as Systems-On-A-Chip (SOCs), include a large number of "cores" that are used as building blocks (also referred to circuit blocks). Each core can have one or more clock domains.

Circuit defects are unavoidable no matter whether the manufacturing process is at the prototype stage or the high-volume manufacturing stage. It is thus necessary to test chips during the manufacturing process. Structural testing attempts to ascertain that the circuit-under-test has been assembled correctly from some low-level building blocks as specified in a structural netlist and that these low-level building blocks and their wiring connections have been manufactured without defect. Scan testing is the most common technique of structural testing. Under this technique, a series of known values (test stimuli or test pattern) are shifted-in (or loaded into) state elements called scan cells through their sequential inputs. These scan cells are interconnected into scan chains for scan testing. The shifting-in occurs by placing the integrated circuit in a special mode, known as shift mode, and then applying a series of clock pulses, called "shift pulses" or "shift clock pulses." Each shift clock pulse pushes a bit of test stimuli into a scan cell in each of the scan chains. This continues until all scan cells in the scan chains are filled with test pattern bits.

Then, one or more clock pulses, called "capture pulses" or "capture clock pulses," are applied to the circuit as they would be in normal operation. This is referred to as capture mode. After the test pattern bits are injected into the circuit, the results of the test (test responses) are "captured" and stored in the scan cells. The circuit then returns to shift mode, and with each additional clock pulse, a bit of the test responses is pushed or shifted out as each bit of new test pattern is pushed or shifted in. The shifted out test responses are then compared with expected results to determine and locate any errors. Shift mode and capture mode together may be called as test mode.

Shift clock pulses and capture clock pulses can be derived from a system clock signal. To reduce power dissipation, the frequency of shift clock pulses is often kept lower than the system clock signal, for example, a frequency between 20 MHz and 100 MHz vs. several GHz. If a circuit block under test has a single clock entry point for a system clock using clock tree technology, on-chip clock control circuitry for deriving shift clock pulses and capture clock pulses from the system clock can be inserted at the clock entry point. At advanced technology nodes, the manufacturing process exhibits multiple sources of on-chip variations effects. Clock mesh technology provides uniform, low skew clock distribution and offers better tolerance to on-chip variations than clock tree technology. In clock mesh technology, each circuit block can have hundreds or even thousands of balanced clock entry points. Shift clock pulses and capture clock pulses need be generated at the base of the clock mesh if conventional technology is employed. This arrangement, however, prevents multiple cores receiving the same system clock signal from being tested independently. Further, each of the multiple cores may have multiple clock domains driven by different system clocks. These system clocks are often asynchronous. It is thus challenging to inject scan test clocks locally for independently testing multiple cores in clock mesh architecture.

BRIEF SUMMARY OF THE DISCLOSED TECHNIQUES

Various aspects of the disclosed technology relate to local clock injection for independent testing of multiple circuit blocks in clock mesh architecture. In one aspect, there is a circuit, comprising: a burst clock control and gating device configured to generate a modified clock signal in a test mode by allowing a preset number of clock pulses of a clock signal to go through during each clock cycle of a reference clock signal; and a plurality of clock gating devices, each of the plurality of clock gating devices comprising: a multiplexing device, wherein the modified clock signal is coupled to a selector input of the multiplexing device, and input signal generation circuitry configured to generate, and to send to inputs of the multiplexing device, a first input signal which does not change when the selector input is at "0" and a second input signal which does not change when the selector input is at "1", wherein the multiplexing device selects the first input signal to send to an output of the multiplexing device when the selector input is at "0" and selects the second input signal to send to the output of the multiplexing device outputted when the selector input is at "1".

The circuit may further comprise: a second burst clock control and gating device configured to generate a second modified clock signal in the test mode by allowing a second preset number of clock pulses of a second clock signal to go through during each clock cycle of the reference clock signal, the second clock signal having a clock frequency different from the clock signal; and a second plurality of clock gating devices, wherein the second modified clock signal is coupled to a selector input of a multiplexing device in each of the second plurality of clock gating devices. The reference clock signal may be a bus clock signal for a data bus which transports test data in the test mode or is obtained by dividing frequency of the clock signal or the second clock signal.

The preset number of clock pulses of the clock signal may be a largest even integer of clock pulses of the clock signal fitting in one clock cycle of the reference clock signal.

The input signal generation circuitry may receive a shift clock enable signal and a capture clock enable signal and generate the first input signal and the second input signal based at least in part on the shift clock enable signal and the capture clock enable signal, and the output of the multiplexing device may comprise clock pulses for scan shift and for scan capture corresponding to the shift clock enable signal and the capture clock enable signal, respectively.

The input signal generation circuitry may comprise logic gates and latches which generate the first input signal and the second input signal based on a third signal and a fourth signal, and wherein the output of the multiplexing follows the clock signal when the third signal is at "1" and the fourth signal is at either "0" or "1", is at "0" when both the third signal and the fourth signal are at "0", and is at "1" when the third signal is at "0" and the fourth signal are at "1". The each of the plurality of clock gating devices may further comprise a device configured to generate the third signal and the fourth signal based on scan clock control signals, the scan clock control signals comprising a shift clock enable signal and a capture clock enable signal. Alternatively, the circuit may further comprise a device configured to generate the third signal and the fourth signal based on scan clock control signals, the scan clock control signals comprising a shift clock enable signal and a capture clock enable signal.

The circuit may further comprise a plurality of circuit blocks, and clock mesh circuitry configured to provide the clock signal or the modified clock signal to each of the plurality of circuit blocks through a plurality of clock entry points, wherein each of the plurality of clock entry points is coupled to one of the plurality of clock gating devices.

In another aspect, there are one or more non-transitory computer-readable media storing computer-executable instructions for causing one or more processors to perform a method, the method comprising: creating the above circuit in a circuit design for testing a chip fabricated according to the circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 4 illustrates an example of a block diagram of a burst clock control device and an example of corresponding waveforms for the burst clock control device according to various embodiments of the disclosed technology.

DETAILED DESCRIPTION OF THE DISCLOSED TECHNIQUES

Various aspects of the disclosed technology relate to local clock injection for independent testing of multiple circuit blocks in clock mesh architecture. In the following description, numerous details are set forth for the purpose of explanation. However, one of ordinary skill in the art will realize that the disclosed technology may be practiced without the use of these specific details. In other instances, well-known features have not been described in detail to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "couple" and "generate" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Figure 1:
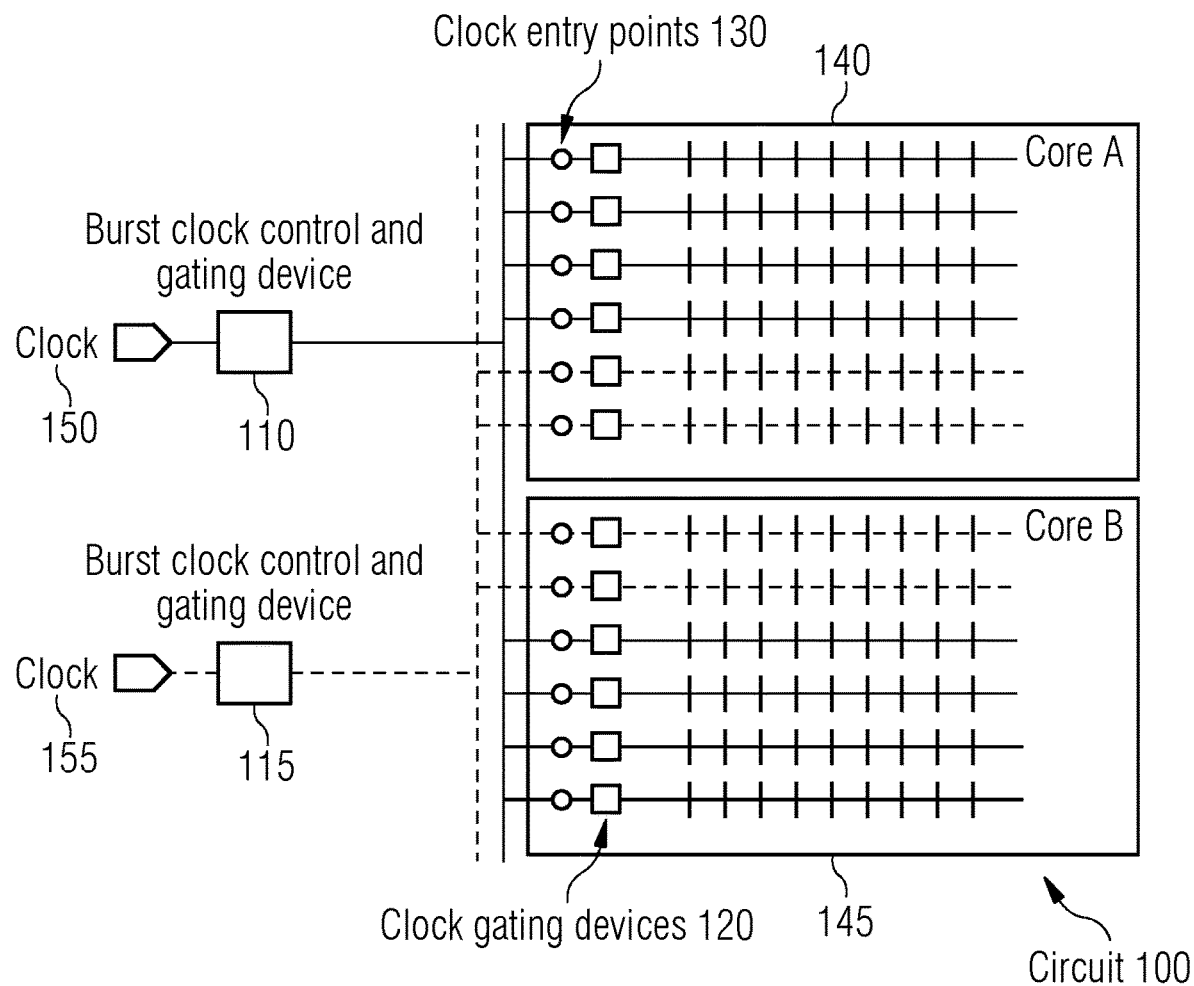
FIG. 1 illustrates an example of a circuit configured to generate scan test clock signals for testing cores independently in clock mesh architecture according to various embodiments of the disclosed technology.

FIG. 1 illustrates an example of a circuit 100 configured to generate scan test clock signals for testing cores independently in clock mesh architecture according to various embodiments of the disclosed technology. The circuit 100 comprises two circuit blocks (cores) 140 and 145. Two system clock signals 150 and 155 enter each of the circuit blocks 140 and 145 through multiple clock entry points 130. At each of the clock entry points 130, one of clock gating devices 120 is inserted. At bases of the clock meshes, burst clock control and gating devices 110 and 115 are inserted for the clock signals 150 and 155, respectively. As will be described in detail below, the burst clock control and gating device 110 is configured to generate a modified clock signal from the clock signal 150 in a test mode by allowing a first preset number of clock pulses of the clock signal 150 to go through during each clock cycle of a reference clock signal. Similarly, the burst clock control and gating device 115 is configured to generate a modified clock signal from the clock signal 155 in a test mode by allowing a second preset number of clock pulses of the clock signal 155 to go through during each clock cycle of the same reference clock signal. As also will be described in detail below, each of the clock gating devices 120 receives the modified clock signal from either the burst clock control and gating device 110 or the burst clock control and gating device 115 and can use it to generate scan clock signals.

In a test in which test data are delivered by a tester through a data bus, the reference clock signal used by the burst clock control and gating devices 110 and 115 can be the clock signal driving the data bus or derived from it. In a test in which logic built-in self-test is used, the reference clock signal can be derived by dividing the clock frequency of one of the system clock signals by a number. For example, if the clock signal 150 has a frequency of 1.8 GHz and the clock signal 155 has a frequency of 812 MHz, the reference lock signal can be obtained by dividing the frequency of the clock signal 155 by 4. In this situation, the burst clock control and gating device 115 is not needed for the clock signal 155.

The two clock signals 150 and 155 are often asynchronous, independent high-speed clocks. Thus, they do not run in lockstep, which is problematic for testing a circuit block having two or more clock domains. Even if one is a multiple of the other, a small deviation (e.g., a few parts per million) can cause drifting of one clock signal with respect to the other. By allowing, per reference clock cycle, a fixed number of clock pulses for each of the clock signals 150 and 155 to go through, the burst clock control and gating devices 110 and 115 effectively generate the two modified clock signals operating in lockstep. As a result, the two clock domains can share a single data bus interface device or a single logic BIST controller (which operates on one of the clock domains) for scan data delivery.

Figure 2:
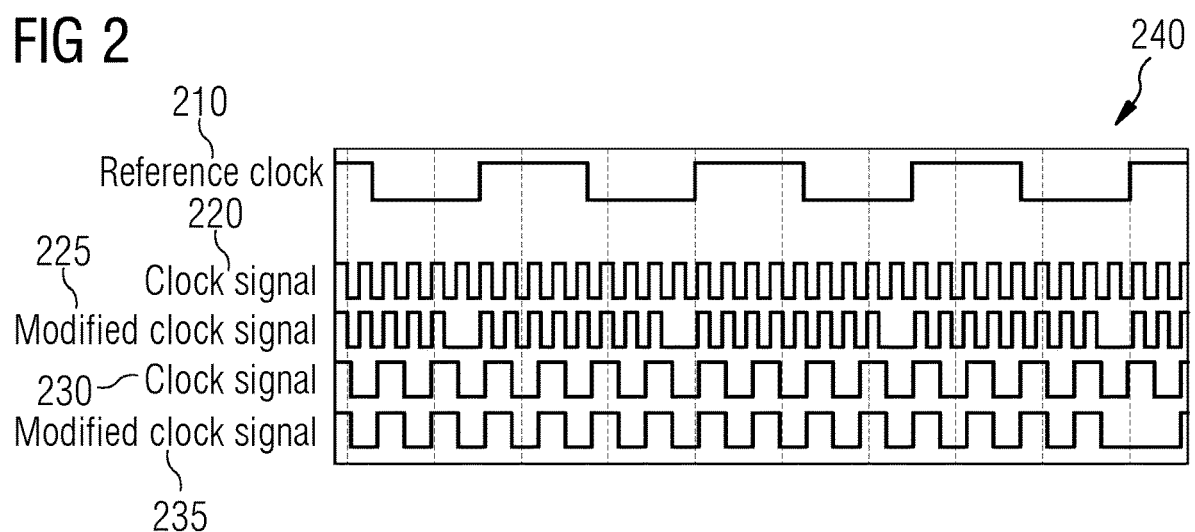
FIG. 2 illustrates an example of waveforms for a reference clock signal, two system clock signals, and corresponding modified clock signals generated by two burst clock control and gating devices, respectively.

FIG. 2 illustrates an example of waveforms for a reference clock signal 210, two system clock signals 220 and 230, and corresponding modified clock signals 225 and 235 generated by the burst clock control and gating devices 110 and 115, respectively. In this example, the frequencies and the corresponding clock periods (in brackets) of the reference clock signal 210 and the two system clock signals 220 and 230 are 200 MHz (5 ns), 1.8 GHz (555 ps) and 812 MHz (1.23 ns), respectively. With some implementations of the disclosed technology, the preset number of clock pulses allowed to go through the corresponding burst clock control and gating device is chosen to be the largest even integer fitting in one reference clock period. In the above example, the preset numbers of clock pulses are eight clock pulses for the clock signal 220 and four clock pulses for the clock signal 230. Because one reference clock cycle can hold nine clock pulses plus a small fraction of a tenth for the clock signal 220, one or two in every nine or ten clock pulses of the modified clock signal 225 are gated off, as illustrated in FIG. 2. On the other hand, four clock periods of the clock signal 230 is nearly as long as one reference clock cycle, and thus one original clock pulse is gated off every sixty-four clock pulses (5/(5−1.232×4)=64). In FIG. 2, the modified clock signal 235 shows that only one pulse at a position 240 is gated off due to the limited width of the window.

Figure 3:
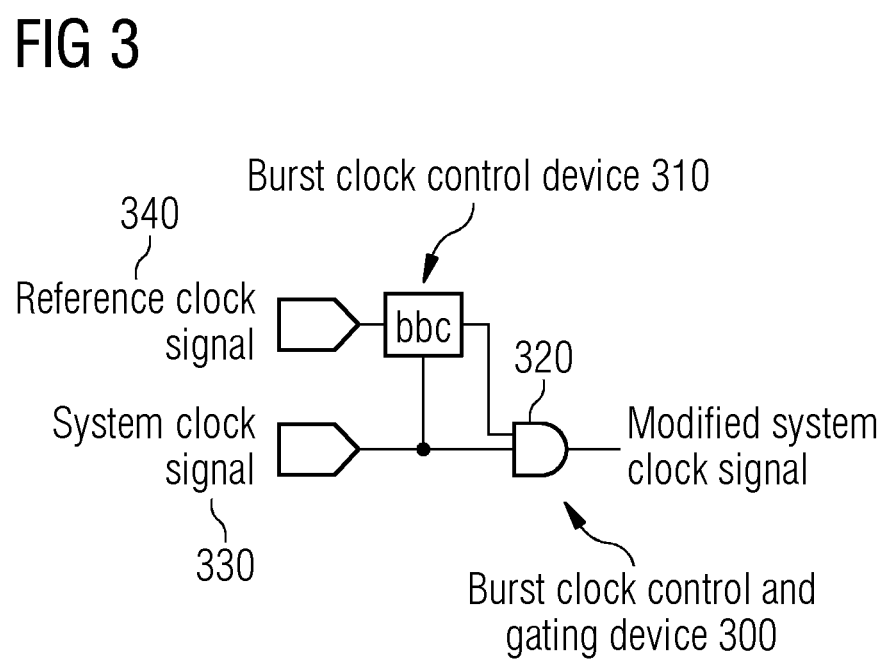
FIG. 3 illustrates an example of a block diagram of a burst clock control and gating device according to various embodiments of the disclosed technology.

FIG. 3 illustrates an example of a block diagram of a burst clock control and gating device 300 according to various embodiments of the disclosed technology. The burst clock control and gating device 300 comprises a burst clock control device 310 and a gating device 320. The burst clock control device 310 can use one or more counters to generate a burst clock control signal based on a reference clock signal 340 and a system clock signal 330. The gating device 320 can then use the burst clock control signal to allow a preset number of clock pulses of the system clock signal 330 to pass through per clock cycle of the reference clock signal 340.

FIG. 4 illustrates an example of a block diagram of a burst clock control device 400 and an example of corresponding waveforms 405 for the burst clock control device 400 according to various embodiments of the disclosed technology. The burst clock control device 400 comprises two registers 460 and 470, two state elements 440 and 450, and two counters 410 and 420. The state elements 440 and 450 are retiming devices and can detect rising edges of a reference clock signal 480. The counter 410 is used to delay the first pulse in a burst of clock pulses of a system clock signal 490 with respect to the rising edge of a pulse of the reference clock signal 480. The delay is to ensure that the first pulse of a burst of system clock pulses aligns close to the rising edge of a pulse of the reference clock signal 480. The counter 420 is used to count a preset number of clock pulses of a system clock signal 490. Under this arrangement, every burst of system clock pulses (the preset number of consecutive clock pulses of the system clock signal 490) will be confined within one clock period of the reference clock signal 480. The registers 460 and 470 are used to store preset number of clock pulses of the system clock signal 490 and the number of clock pulses for delay, respectively.

In the example of the waveforms 405, it is assume to take three clock cycles of the system clock signal 490 to detect a clock edge 485 of the reference clock signal 480. The preset number of the system clock signal 490 to be allowed to pass through the burst clock control device 400 is eight. Then the number of clock pulses for delay can be set as five. As such, the first clock pulse 486 of the first clock burst is close to the next clock edge 487 of the reference clock signal 480. After eight system clock pulses, the ninth one is gated off by a gating device 430. By repeating this process, a modified system clock signal 495 having eight pulses per clock cycle of the reference clock signal 480 is generated.

Figure 5:
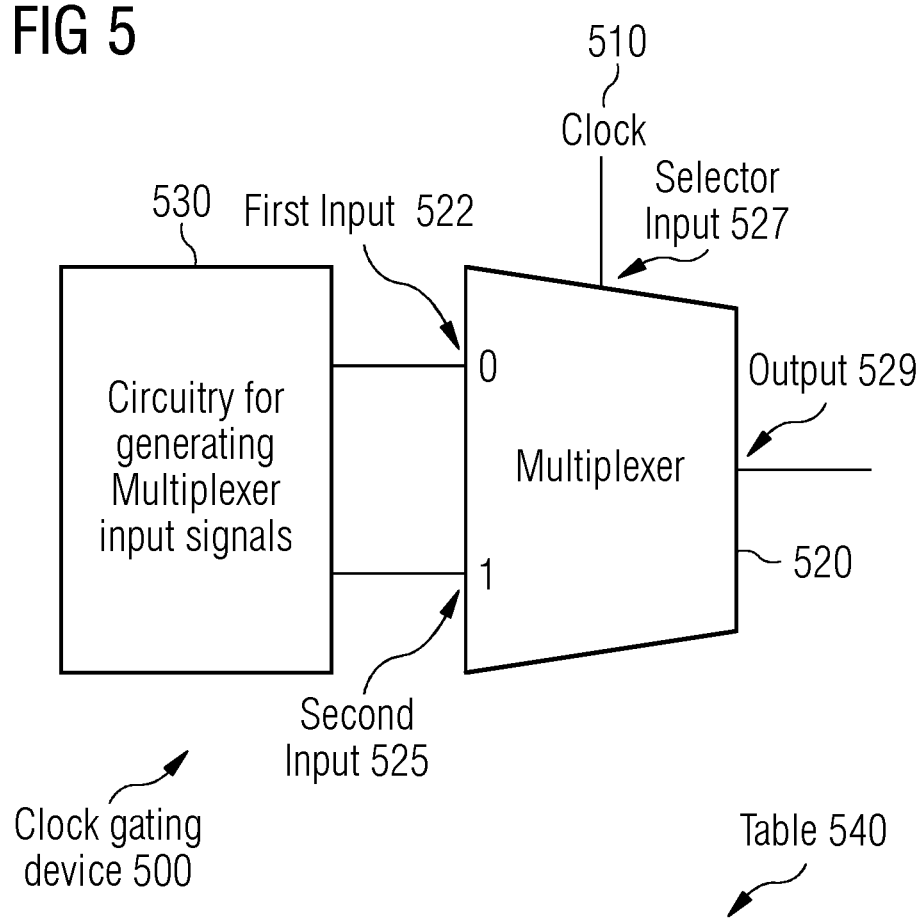
FIG. 5 illustrates an example of a block diagram for a clock gating device according to various embodiments of the disclosed technology.

FIG. 5 illustrates an example of a block diagram for a clock gating device 500 according to various embodiments of the disclosed technology. The clock gating device 500 comprises a multiplexing device 520 and circuitry for generating multiplexer input signals 530. The multiplexing device 520 is a device that selects between signals at two inputs (a first input 522 and a second input 525) based on a signal at a selector input 527, and forwards it to an output 529. The multiplexing device 520 can be implemented with a conventional multiplexer. In contrast to conventional uses of a multiplexer, however, the selector input 527 of the multiplexing device 520 is coupled to a clock signal 510. The clock signal 510 can to be gated to generate capture pulses or used to generate slow shift clock pulses. The clock gating device 500 may be used to implement the clock gating devices 120 shown in FIG. 1, and the clock signal 510 can be a modified system clock signal generated by either the burst clock control and gating device 110 or the burst clock control and gating device 115 depending on the clock domains.

FIG. 5 also illustrates a truth table 540 describing how the multiplexing device 520 operates. When the two inputs 522 and 525 are kept at different logic values, either "1" for one and "0" for the other or the opposite, the output 529 either follows the clock signal 510 or sends out an inverse copy of the clock signal 510. When both of the inputs 522 and 525 are kept at "0", the output 529 is also kept at "0" and thus the clock signal 510 is gated off or disabled. When both of the inputs 522 and 525 are kept at "1", the output 529 is also kept at "1". By keeping the inputs 522 and 525 alternatively at "1" for a number of clock periods of the clock signal 510 and at "0" for the same number of clock periods of the clock signal 510, the multiplexing device 520 can output clock pulses which are slower than the clock signal 510 and have a duty cycle about 50%.

The ability to generate a slow clock with a 50% duty cycle is particularly useful for scan test because both rising and falling edges of a clock pulse are often used for scan shift. A conventional clock gater can generate slow clock pulses from a fast system clock signal, but the duty cycle can be very low. For example, an AND gate-based clock gater allows original clock pulses (1 GHz) to pass through once every 20 clock pulses. The resulted output clock signal is at 50 MHz, twenty times slower than the original one. While this is a typical frequency for scan shift, the duty cycle is only about 2.6%, which can cause timing problems for scan shift. A similar result will be obtained if the multiplexing device 520 is used as a conventional clock gating device with the clock signal 510 coupled to one of its two inputs.

The circuitry for generating multiplexer input signals 530 is configured to generate a first input signal and a second input signal and to send them to the first input 522 and second input 525 of the multiplexing device 520, respectively. The first input signal does not change when the selector input 527 is at "0" and the second input signal does not change when the selector input 527 is at "1". This makes sure that the transitions on the output 529 are timed from the transitions on the clock signal 510.

Figure 6:
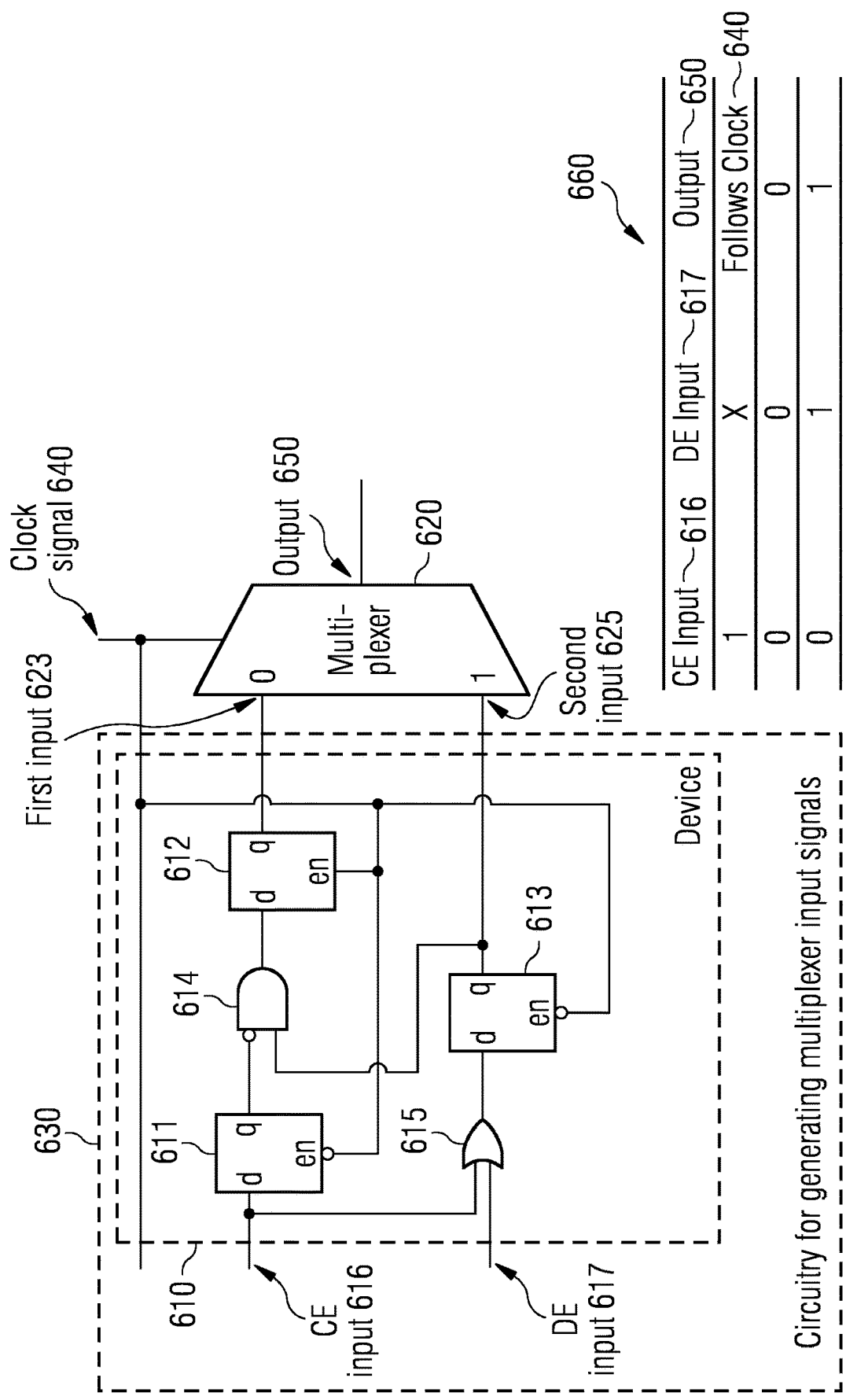
FIG. 6 illustrates an example of a block diagram for circuitry for generating multiplexer input signals according to various embodiments of the disclosed technology.

FIG. 6 illustrates an example of a block diagram for circuitry for generating multiplexer input signals 630 according to various embodiments of the disclosed technology. The circuitry for generating multiplexer input signals 630 comprises a device 610. The device 610 comprises latches 611, 612 and 613, an AND gate 614, and an OR gate 615. A clock signal 640 is coupled to a selector input of a multiplexer 620 and also drives enable/clock inputs of the latches 611, 612 and 613. Here, the latches 611 and 613 updates their outputs only when the clock signal 640 is at "0" while the latch 612 changes its state only when the clock signal 640 is at "1". This arrangement helps ensure that the first input 623 does not change when the clock signal 640 is at "0" and the second input 625 does not change when the clock signal 640 is at "1".

When a CE input 616 of the device 610 is set at "1", the first and second inputs 623, 625 of the multiplexer 620 will be set at "0" and "1", respectively, regardless of whether a DE input 617 is at either "0" or "1". As such, an output 650 of the multiplexer 620 will follow the clock signal 640. When both of the CE input 616 and the DE input 617 are set at "0", both of the first input 623 and the second input 625 are also set at "0" and thus the output 650 will be "0". When the CE input 616 is at "0" and the DE input 617 is at "1", both of the first input 623 and the second input 625 are set at "1" and thus the output 650 will be at "1". The above is summarized in a truth table 660.

Figure 7:
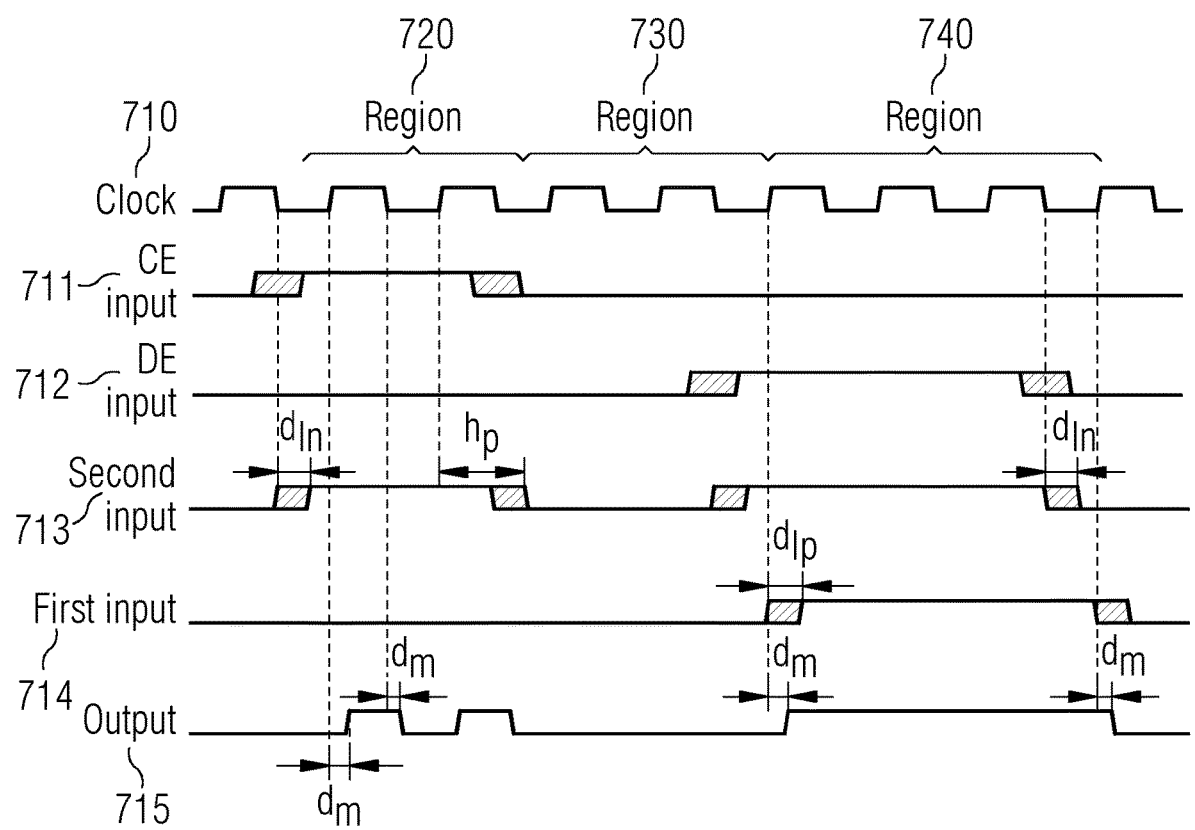
FIG. 7 illustrates an example of waveforms for signals of the clock gating device shown in FIG. 6.

FIG. 7 illustrates an example of waveforms for signals of the clock gating device shown in FIG. 6. Specifically, waveforms for a clock signal 710 and signals at the CE input 711, the DE input 712, the first input 714, the second input 713, and the output 715 are displayed. In the figure, the second input 713 changes only when the clock signal 710 is at "0", and the first input 714 changes only when the clock signal 710 is at "1". In region 720, the output 715 follows the clock signal 710 because the CE input 711 is at "1". Two pulses of the clock signal 710 is thus allowed to pass through the multiplexer 620. In region 730, the output 715 is at "0" because both the CE input 711 and the DE input 712 are at "0". As such, the clock signal 710 is gated off during this period. In region 740, the output 715 is at "1" for about three clock pulses of the clock signal 710 because the CE input 711 is at "0" and the DE input 712 is at "1". The output 715 then returns to "0". If it the output 715 is kept at "0" for three clock period of the clock signal 710 before changes back to "1" and this pattern of alternating between "1" and "0" every three clock periods repeats itself, a slow clock pulses (one third of the frequency of the clock 710) with 50% duty cycle will be generated. These slow clock pulses can be used as scan shift clock pulses. The "at-speed" clock pulses such as the two clock pulses in the region 720 can be used as scan capture clock pulses.

A person of ordinary skill in the art would appreciate that the device 610 shown in FIG. 6 is just an example, and that a different device may be used to generate signals for the two inputs of the multiplexing device according to various embodiments of the disclosed technology.

Figure 8:
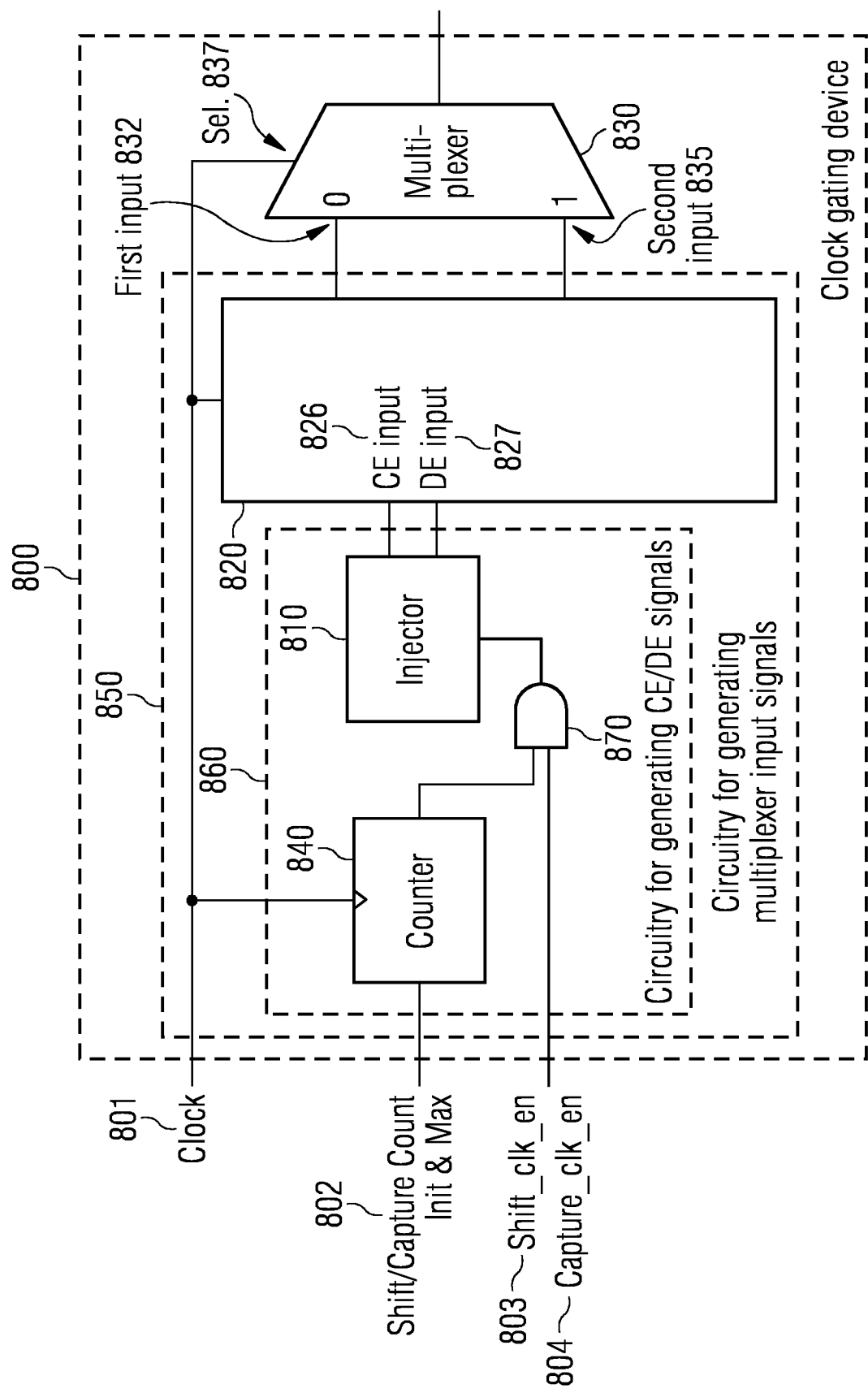
FIG. 8 illustrates an example of a block diagram for a clock gating device which can generate clock pulses for scan shift and scan capture based on scan clock control signals according to various embodiments of the disclosed technology.

FIG. 8 illustrates an example of a block diagram for a clock gating device 800 which can generate clock pulses for scan shift and scan capture based on scan clock control signals according to various embodiments of the disclosed technology. Like the clock gating device 500 shown in FIG. 5, the clock gating device 800 comprises a multiplexing device 830 and circuitry for generating multiplexer input signals 850. Unlike the circuitry for generating multiplexer input signals 630 in FIG. 6, the circuitry for generating multiplexer input signals 850 is shown to comprise not only a device 820 but also circuitry for generating CE/DE signals 860. The device 820 generates signals for a first input 832 and a second input 835 of the multiplexing device 830 based on CE and DE signals received at a CE input 826 and a DE input 827, respectively. An example of the device 820 is the device 610 shown in FIG. 6. A clock signal 801 is coupled to a selector input 837 of the multiplexing device 830, and also drives the device 820.

The circuitry for generating CE/DE signals 860 comprises a counter device 840, an injector device 810 and a gating device 870. It generates the CE and DE signals based on a shift clock enable signal 803 and a capture clock enable signal 804. The shift clock enable signal 803 and the capture clock enable signal 804 may be generated by a test controller such as a logic BIST (built-in self-test) controller or a data bus interface device for the circuit block of interest. Here, the data bus delivers scan data to each of circuit blocks (cores) in the circuit under test.

The counter device 840 is driven by the clock signal 801 and generates clock pulses based on preset shift pulse count initial & maximum numbers and capture pulse count initial & maximum numbers 802. The gating device 870 uses these clock pulses to gate the shift clock enable signal 803 and the capture clock enable signal 804. The injector 810 then generates the CE and DE signals based on the output of the gating device 870. It should be noted that additional clock control signals such as a test compression clock enable signal for a test compression controller may be supplied to the gating device 870. The clock gating device 800 can generate clock pulses for the test compression controller based on the test compression clock enable signal. The circuitry for generating CE/DE signals 860 allows the scan clock control signals such as the shift clock enable signal 803 and the capture clock enable signal 804 to be transported through multicycle paths rather than through pipeline paths.

Figure 9:
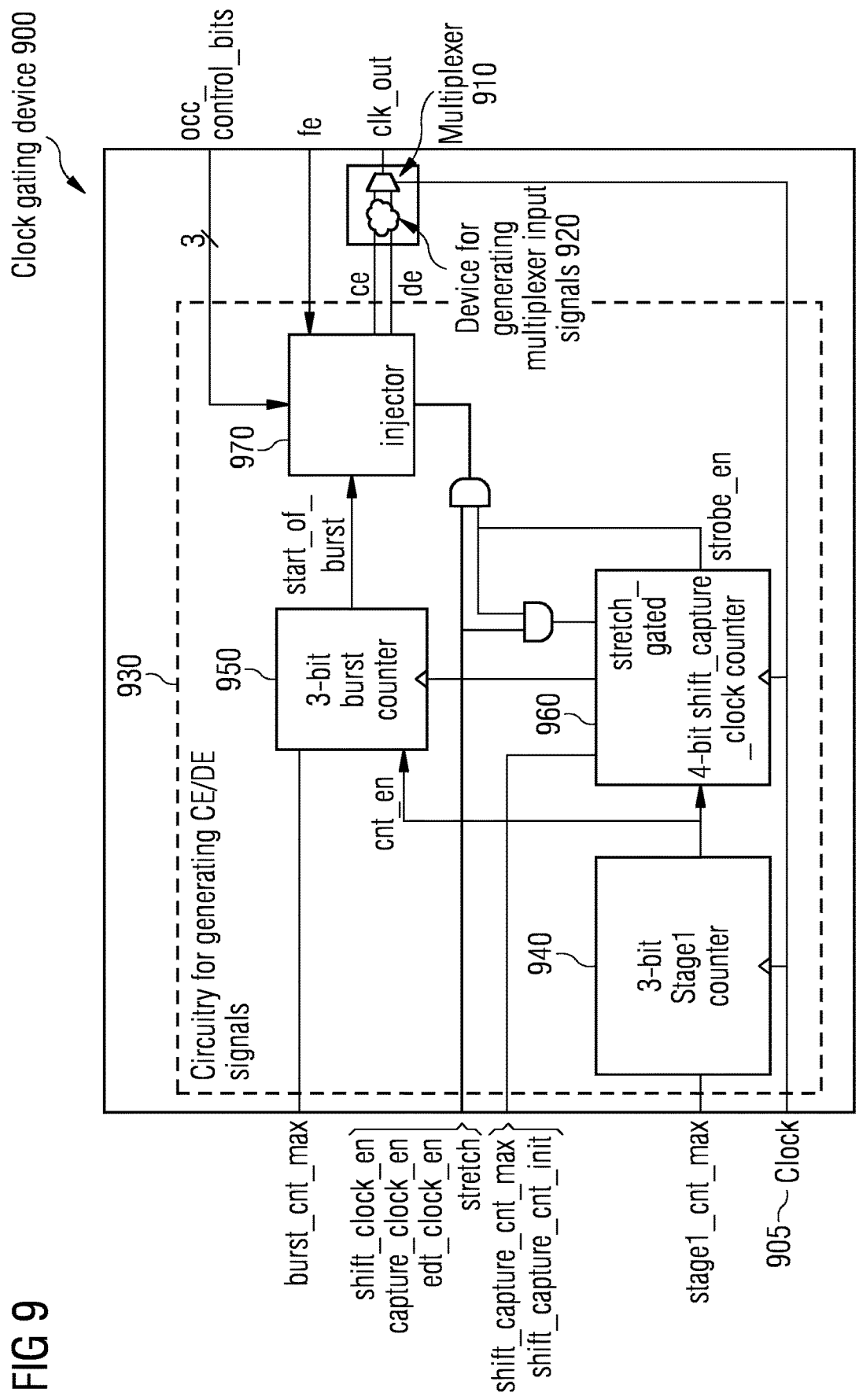
FIG. 9 illustrates another example of a block diagram for a clock gating device which can generate clock pulses for scan shift and capture, for test compression controllers, and for a data bus interface device for a circuit block according to various embodiments of the disclosed technology.

FIG. 9 illustrates another example of a block diagram for a clock gating device 900 which can generate clock pulses for scan shift and capture, for test compression controllers, and for a data bus interface device for a circuit block according to various embodiments of the disclosed technology. Like the clock gating device 800 in FIG. 8, the clock gating device 900 comprises a multiplexing device 910, a device for generating multiplexer input signals 920, and circuitry for generating CE/DE signals 930. Unlike the circuitry for generating CE/DE signals 860 in FIG. 8, the circuitry for generating CE/DE signals 930 is shown to have at least three rather than one counter devices: a three-bit stage-1 counter device 940, a three-bit burst counter device 950 and a four-bit counter device 960. The three-bit stage-1 counter device 940 is used to divide the frequency of a clock signal 905 to generate a slow clock signal for the data bus interface device. The clock signal 905 can be derived from a system clock signal by a burst clock control and gating device such as the burst clock control and gating device 400 shown in FIG. 4. If the clock signal 905 has eight pulses within one clock cycle of the reference clock signal (about 1.6 GHz), for example, the clock signal 905 can be divided by 4 to obtain a 400 MHz clock signal for the data bus interface device. Here, the data bus interface device is designed to operate at two times the frequency of the reference clock signal for the data bus.

The four-bit counter device 960 and the three-bit stage-1 counter device 940 work together to produce a signal with a frequency needed for scan shift, for example, 80 MHz. The obtained signal is use to gate a shift clock enable signal to produce pulses for an injector device 970. The injector device 970 can use them to produce a DE signal needed for producing slow scan shift clock pulses with duty cycle close to 50%. The three-bit burst counter device 950 is used to ensure at-speed capture pulses to be generated close to the start of a burst of pulses of the modified clock signal 905.

Figure 10:
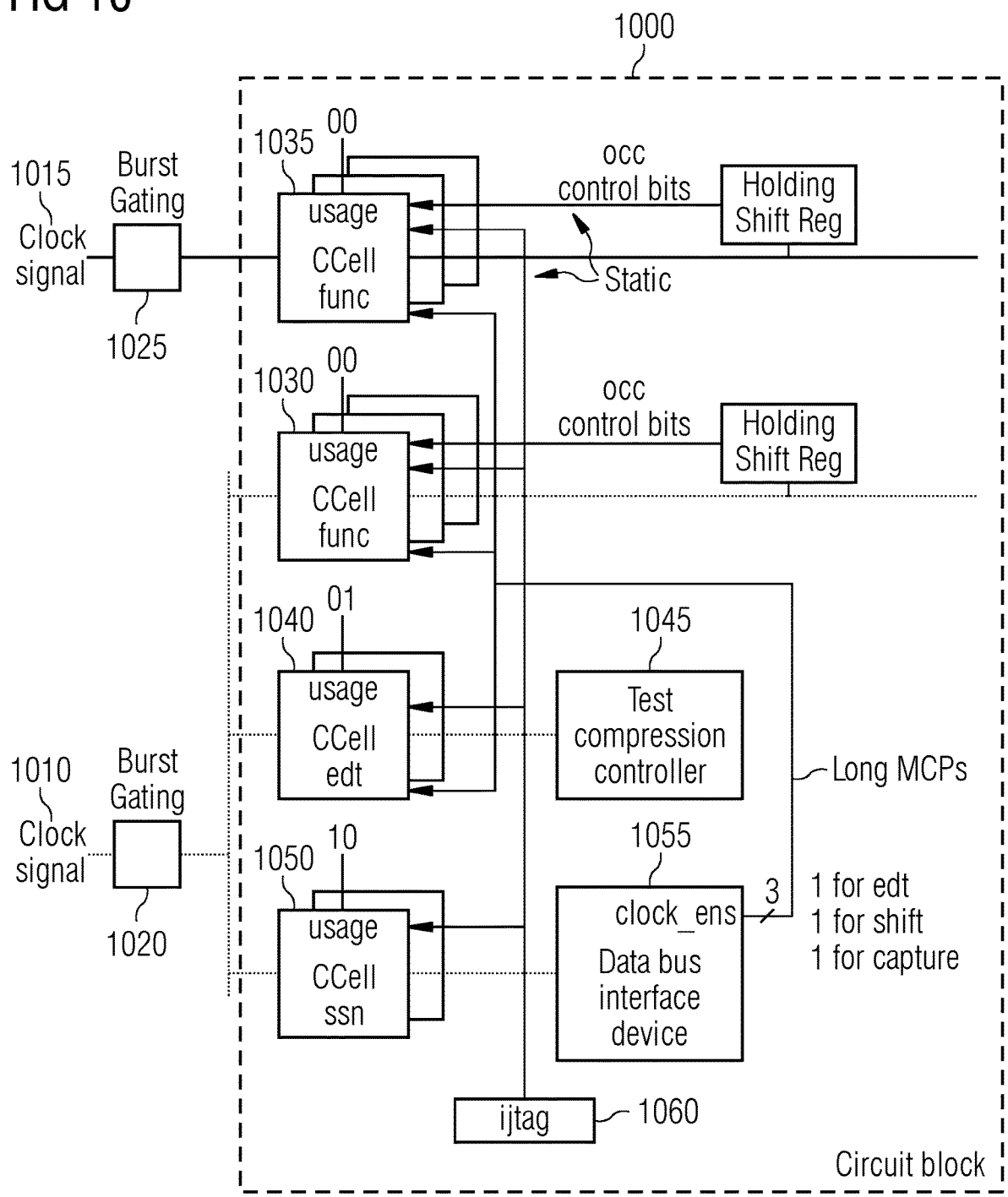
FIG. 10 illustrates an example of a circuit block comprising two clock domains, clock gating devices, and burst clock control and gating devices according to various embodiments of the disclosed technology.

FIG. 10 illustrates an example of a circuit block 1000 comprising two clock domains, clock gating devices, and burst clock control and gating devices according to various embodiments of the disclosed technology. Two clock signals 1010 and 1015 for the two clock domains enters the circuit block 1000 in clock mesh architecture. Two burst clock control and gating devices 1020 and 1025 are inserted at the bases of the clock signals 1010 and 1015, respectively, to convert them into modified clock signals with fixed numbers of clock pulses per clock cycle of a reference clock signal (not shown) in the test mode. Two groups of clock gating devices 1030 and 1035 are configured in the test mode ("00") to drive functional circuits and scan chains in the two clock domains, respectively. A third group of clock gating devices 1040 are configured in the test mode ("01") to drive one or more test compression controllers 1045 used in the circuit block 1000. A fourth group of clock gating devices 1050 are configured in the test mode ("10") to drive a data bus interface device 1055 for the circuit block 1000. These clock gating devices 1030, 1035, 1040 and 1050 can be implemented using the clock gating device 900 in FIG. 9. The burst clock control and gating devices 1020 and 1025 can be implemented using the burst clock control device 400 along with the gating device 430 in FIG. 4. The data bus interface device 1055 can be configured to generate three multi-cycle path signals (scan shift clock enable, scan capture clock enable, and test compression controller clock enable) for the clock gating devices 1030, 1035, and 1040. The static configuration signals for these clock gating devices 1030, 1035, 1040 and 1050 can be delivered through an IJTAG network 1060.

Figure 11:
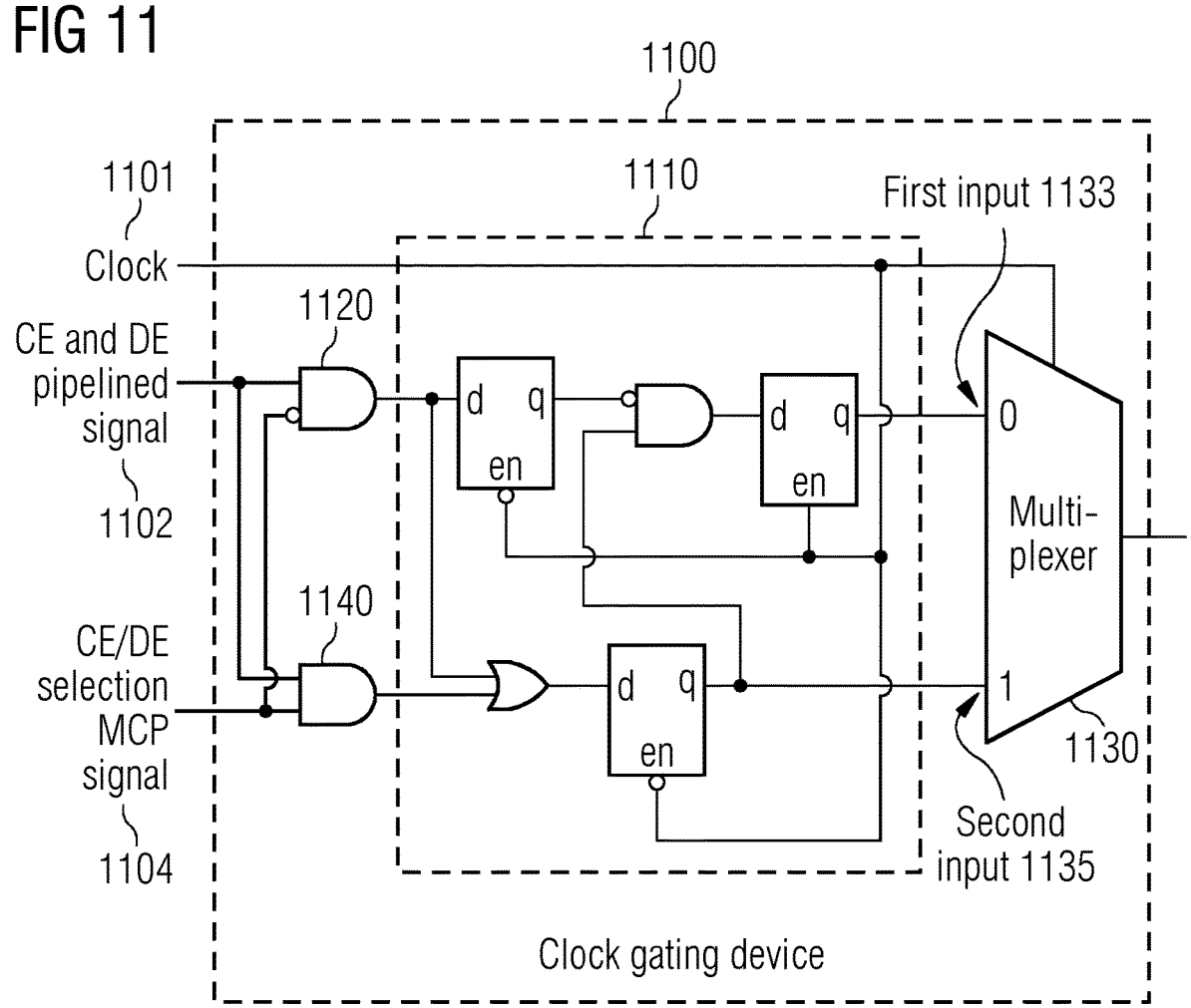
FIG. 11 illustrates an example of a clock gating device having smaller footprint than the clock gating device in FIG. 9 according to various embodiments of the disclosed technology.

FIG. 11 illustrates an example of a clock gating device 1100 having smaller footprint than the clock gating device 900 in FIG. 9 according to various embodiments of the disclosed technology. The clock gating device 1100 comprises a multiplexing device 1130, a device 1110 for generating input signals for the multiplexing device 1130, and two AND gates 1120 and 1140. The device 1110 is shown to have the same topology as the device 610 shown in FIG. 6. It should be noted, however, that a device different from the device 610 may be employed here as long as it can follow the truth table 660 shown in FIG. 6 and ensure that the first input signal 1133 does not change when the selector input of the multiplexing device 1130 is at "0" and that the second input signal 1135 does not change when the selector input of the multiplexing device 1130 is at "1".

Unlike the clock gating device 900, the clock gating device 1100 does not have a device similar to the circuitry for generating CE/DE signals 960. Instead, the CE and DE signals for the device 1110 are delivered through a single pipeline path, referred to as a CE and DE pipelined signal 1102 in the figure. This is feasible because the CE and DE signals do not need to be changed in the same time. A CE/DE selection MCP signal 1104 is used to decouple the CE and DE signals from the CE and DE pipelined signal 1102 using the two AND gates 1120 and 1140. As the name suggests, the CE/DE selection MCP signal 1104 can be send through a multicycle path. This architecture reduces pipeline devices needed.

Figure 12:
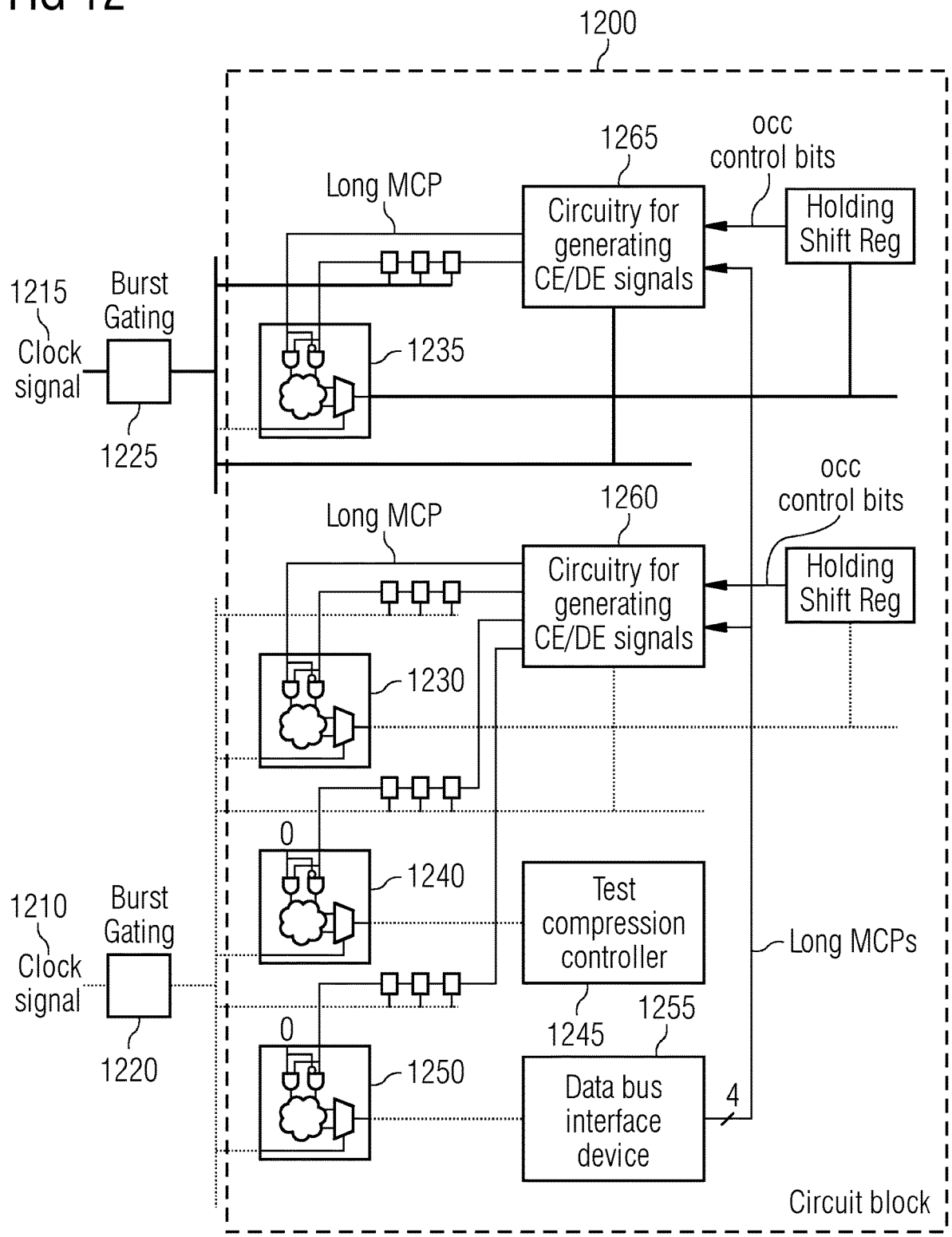
FIG. 12 illustrates an example of a circuit block comprising two clock domains, clock gating devices, burst clock control and gating devices, and circuitry for generating CE/DE signals in each of the two clock domain according to various embodiments of the disclosed technology.

FIG. 12 illustrates an example of a circuit block 1200 comprising two clock domains, clock gating devices, burst clock control and gating devices, and circuitry for generating CE/DE signals in each of the two clock domain according to various embodiments of the disclosed technology. Two clock signals 1210 and 1215 for the two clock domains enters the circuit block 1200 in clock mesh architecture. Two burst clock control and gating devices 1220 and 1225 are inserted at the bases of the clock signals 1210 and 1215, respectively, to convert them into modified clock signals with fixed numbers of clock pulses per clock cycle of a reference clock signal (not shown) in the test mode. Two groups of clock gating devices 1230 and 1235 are configured in the test mode to drive functional circuits and scan chains in the two clock domains, respectively. A third group of clock gating devices 1240 are configured in the test mode to drive one or more test compression controllers 1245 used in the circuit block 1000. A fourth group of clock gating devices 1250 are configured in the test mode to drive a data bus interface device 1255 for the circuit block 1200. These clock gating devices 1230, 1235, 1240 and 1250 can be implemented using the clock gating device 1100 in FIG. 11. The burst clock control and gating devices 1220 and 1225 can be implemented using the burst clock control and gating device shown in FIG. 4. The data bus interface device 1255 can be configured to generate multi-cycle path signals including scan shift clock enable, scan capture clock enable, and test compression controller clock enable for circuitry for generating CE/DE signals 1260 in one clock domain for the clock signal 1210 and for circuitry for generating CE/DE signals 1265 in the other clock domain for the clock signal 1215. The circuitry for generating CE/DE signals 1260 and 1265 can be implemented by the circuitry for generating CE/DE signals 930 in FIG. 9 along with a circuit that can combines the CE and DE signals into a single CE/DE signal and also can generate another decoupling signal to be used for decoupling the signal CE/DE signal. The single CE/DE signal is transmitted through a pipeline path while the decoupling signal can be transmitted through a multi-cycle path (MCP). These two signals are used by the clock gating devices 1230, 1235, 1240 and 1250.

Figure 13:
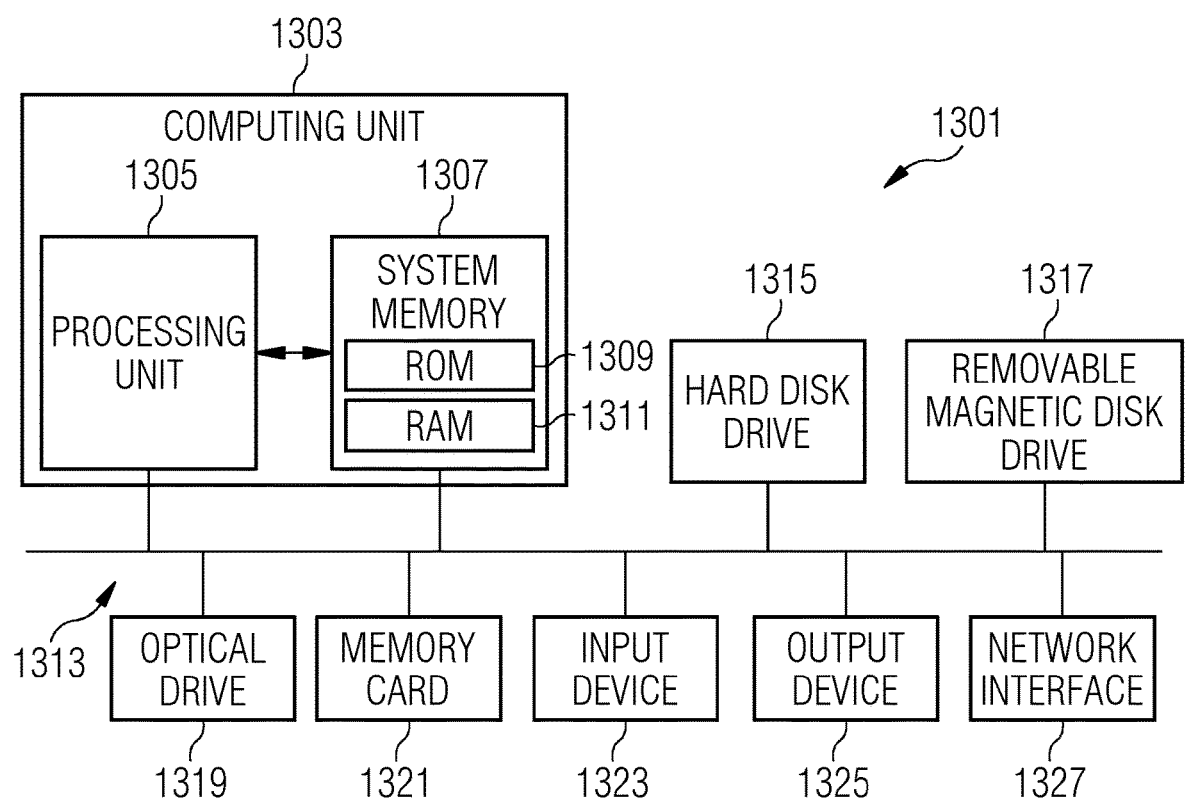
FIG. 13 illustrates a programmable computer system with which various embodiments of the disclosed technology may be employed.

Various examples of the disclosed technology may be implemented through the execution of software instructions by a computing device, such as a programmable computer. Accordingly, FIG. 13 shows an illustrative example of a computing device 1301. As seen in this figure, the computing device 1301 includes a computing unit 1303 with a processing unit 1305 and a system memory 1307. The processing unit 1305 may be any type of programmable electronic device for executing software instructions, but it will conventionally be a microprocessor. The system memory 1307 may include both a read-only memory (ROM) 1309 and a random access memory (RAM) 1311. As will be appreciated by those of ordinary skill in the art, both the read-only memory (ROM) 1309 and the random access memory (RAM) 1311 may store software instructions for execution by the processing unit 1305.

The processing unit 1305 and the system memory 1307 are connected, either directly or indirectly, through a bus 1313 or alternate communication structure, to one or more peripheral devices. For example, the processing unit 1305 or the system memory 1307 may be directly or indirectly connected to one or more additional memory storage devices, such as a "hard" magnetic disk drive 1315, a removable magnetic disk drive 1317, an optical disk drive 1319, or a flash memory card 1321. The processing unit 1305 and the system memory 1307 also may be directly or indirectly connected to one or more input devices 1323 and one or more output devices 1325. The input devices 1323 may include, for example, a keyboard, a pointing device (such as a mouse, touchpad, stylus, trackball, or joystick), a scanner, a camera, and a microphone. The output devices 1325 may include, for example, a monitor display, a printer and speakers. With various examples of the computer 1301, one or more of the peripheral devices 1315-1325 may be internally housed with the computing unit 1303. Alternately, one or more of the peripheral devices 1315-1325 may be external to the housing for the computing unit 1303 and connected to the bus 1313 through, for example, a Universal Serial Bus (USB) connection.

With some implementations, the computing unit 1303 may be directly or indirectly connected to one or more network interfaces 1327 for communicating with other devices making up a network. The network interface 1327 translates data and control signals from the computing unit 1303 into network messages according to one or more communication protocols, such as the transmission control protocol (TCP) and the Internet protocol (IP). Also, the interface 1327 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 1301 is illustrated as an example only, and it is not intended to be limiting. Various embodiments of the disclosed technology may be implemented using one or more computing devices that include the components of the computer 1301 illustrated in FIG. 13, which include only a subset of the components illustrated in FIG. 13, or which include an alternate combination of components, including components that are not shown in FIG. 13. For example, various embodiments of the disclosed technology may be implemented using a multiprocessor computer, a plurality of single and/or multiprocessor computers arranged into a network, or some combination of both.

Conclusion

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A circuit, comprising:
   a burst clock control and gating device configured to generate a modified clock signal in a test mode by allowing a preset number of clock pulses of a clock signal to go through during each clock cycle of a reference clock signal; and
   a plurality of clock gating devices, each of the plurality of clock gating devices comprising:

a multiplexing device, wherein the modified clock signal is coupled to a selector input of the multiplexing device, and input signal generation circuitry configured to generate, and to send to inputs of the multiplexing device, a first input signal which does not change when the selector input is at "0" and a second input signal which does not change when the selector input is at "1", wherein the input signal generation circuitry generates the first input signal and the second input signal based on a third signal, a fourth signal and the modified clock signal, and wherein the each of the plurality of clock gating devices is configurable to output, based on the third signal and the fourth signal, clock pulses following the modified clock signal, one or more pulses with pulse width and location controlled by one or both of the third signal and the fourth signal, or both in different time periods.

2. The circuit recited in claim 1, further comprising:
a second burst clock control and gating device configured to generate a second modified clock signal in the test mode by allowing a second preset number of clock pulses of a second clock signal to go through during each clock cycle of the reference clock signal, the second clock signal having a clock frequency different from the clock signal; and
a second plurality of clock gating devices, wherein the second modified clock signal is coupled to a selector input of a multiplexing device in each of the second plurality of clock gating devices.

3. The circuit recited in claim 2, wherein the reference clock signal is a bus clock signal for a data bus which transports test data in the test mode or is obtained by dividing frequency of the clock signal or the second clock signal.

4. The circuit recited in claim 1, wherein the preset number of clock pulses of the clock signal is a largest even integer of clock pulses of the clock signal fitting in one clock cycle of the reference clock signal.

5. The circuit recited in claim 1, wherein the input signal generation circuitry receives a shift clock enable signal and a capture clock enable signal and generates the first input signal and the second input signal based at least in part on the shift clock enable signal and the capture clock enable signal, and wherein the output of the multiplexing device comprises clock pulses for scan shift and for scan capture corresponding to the shift clock enable signal and the capture clock enable signal, respectively.

6. The circuit recited in claim 1, wherein the input signal generation circuitry comprises logic gates and latches, and wherein the output of the multiplexing follows the modified clock signal when the third signal is at "1" and the fourth signal is at either "0" or "1", is at "0" when both the third signal and the fourth signal are at "0", and is at "1" when the third signal is at "0" and the fourth signal are at "1".

7. The circuit recited in claim 6, wherein the each of the plurality of clock gating devices further comprises a device configured to generate the third signal and the fourth signal based on scan clock control signals, the scan clock control signals comprising a shift clock enable signal and a capture clock enable signal.

8. The circuit recited in claim 6, further comprising:
a device configured to generate the third signal and the fourth signal based on scan clock control signals, the scan clock control signals comprising a shift clock enable signal and a capture clock enable signal.

9. The circuit recited in claim 1, further comprising:
a plurality of circuit blocks, and
clock mesh circuitry configured to provide the clock signal or the modified clock signal to each of the plurality of circuit blocks through a plurality of clock entry points,
wherein each of the plurality of clock entry points is coupled to one of the plurality of clock gating devices.

10. One or more non-transitory computer-readable media storing computer-executable instructions for causing a computer to perform a method, the method comprising:
creating a burst clock control and gating device and a plurality of clock gating devices in a circuit design for testing a chip fabricated according to the circuit design, the burst clock control and gating device being configured to generate a modified clock signal in a test mode by allowing a preset number of clock pulses of a clock signal to go through during each clock cycle of a reference clock signal, and each of the plurality of clock gating devices comprising:
a multiplexing device, wherein the modified clock signal is coupled to a selector input of the multiplexing device, and
input signal generation circuitry configured to generate, and to send to inputs of the multiplexing device, a first input signal which does not change when the selector input is at "0" and a second input signal which does not change when the selector input is at "1", wherein the input signal generation circuitry generates the first input signal and the second input signal based on a third signal, a fourth signal and the modified clock signal, and wherein the each of the plurality of clock gating devices is configurable to output, based on the third signal and the fourth signal, clock pulses following the modified clock signal, one or more pulses with pulse width and location controlled by one or both of the third signal and the fourth signal, or both in different time periods.

11. The one or more non-transitory computer-readable media recited in claim 10, wherein the method further creates:
a second burst clock control and gating device configured to generate a second modified clock signal in the test mode by allowing a second preset number of clock pulses of a second clock signal to go through during each clock cycle of the reference clock signal, the second clock signal having a clock frequency different from the clock signal; and
a second plurality of clock gating devices, wherein the second modified clock signal is coupled to a selector input of a multiplexing device in each of the second plurality of clock gating devices.

12. The one or more non-transitory computer-readable media recited in claim 11, wherein the reference clock signal is a bus clock signal for a data bus which transports test data in the test mode or is obtained by dividing frequency of the clock signal or the second clock signal.

13. The one or more non-transitory computer-readable media recited in claim 10, wherein the preset number of clock pulses of the clock signal is a largest even integer of clock pulses of the clock signal fitting in one clock cycle of the reference clock signal.

14. The one or more non-transitory computer-readable media recited in claim 10, wherein the input signal generation circuitry receives a shift clock enable signal and a capture clock enable signal and generates the first input signal and the second input signal based at least in part on the shift clock enable signal and the capture clock enable signal, and wherein the output of the multiplexing device comprises clock pulses for scan shift and for scan capture corresponding to the shift clock enable signal and the capture clock enable signal, respectively.

15. The one or more non-transitory computer-readable media recited in claim 10, wherein the input signal generation circuitry comprises logic gates and latches, and wherein the output of the multiplexing follows the modified clock signal when the third signal is at "1" and the fourth signal is at either "0" or "1", is at "0" when both the third signal and the fourth signal are at "0", and is at "1" when the third signal is at "0" and the fourth signal are at "1".

16. The one or more non-transitory computer-readable media recited in claim 15, wherein the each of the plurality of clock gating devices further comprises a device configured to generate the third signal and the fourth signal based on scan clock control signals, the scan clock control signals comprising a shift clock enable signal and a capture clock enable signal.

17. The one or more non-transitory computer-readable media recited in claim 15, wherein the method further creates a device configured to generate the third signal and the fourth signal based on scan clock control signals, the scan clock control signals comprising a shift clock enable signal and a capture clock enable signal.

* * * * *